US007341651B2

(12) United States Patent
Regan et al.

(10) Patent No.: US 7,341,651 B2
(45) Date of Patent: Mar. 11, 2008

(54) NANOSCALE MASS CONVEYORS

(75) Inventors: Brian C. Regan, Oakland, CA (US); Shaul Aloni, Albany, CA (US); Alexander K. Zettl, Kensington, CA (US)

(73) Assignee: The Regents of the University of California, Oakland, CA (US)

( * ) Notice: Subject to any disclaimer, the term of this patent is extended or adjusted under 35 U.S.C. 154(b) by 85 days.

(21) Appl. No.: 11/085,397

(22) Filed: Mar. 21, 2005

(65) Prior Publication Data

US 2006/0057767 A1 Mar. 16, 2006

Related U.S. Application Data

(60) Provisional application No. 60/560,492, filed on Apr. 7, 2004, provisional application No. 60/555,458, filed on Mar. 22, 2004.

(51) Int. Cl.
*G01N 27/447* (2006.01)
*G01N 27/453* (2006.01)

(52) U.S. Cl. .................. 204/450; 204/600; 977/962

(58) Field of Classification Search ................ 204/451, 204/450, 600, 601; 977/962
See application file for complete search history.

(56) References Cited

U.S. PATENT DOCUMENTS

| | | | |
|---|---|---|---|
| 5,413,866 A | 5/1995 | Baker et al. | |
| 5,458,784 A | 10/1995 | Baker et al. | |
| 5,653,951 A | 8/1997 | Rodriguez et al. | |
| 6,159,538 A | 12/2000 | Rodriguez et al. | |
| 6,773,616 B1 | 8/2004 | Chen et al. | |
| 7,077,939 B1 * | 7/2006 | Crooks et al. | 204/450 |
| 2002/0004136 A1 | 1/2002 | Gao et al. | |
| 2002/0179434 A1 | 12/2002 | Dai et al. | |
| 2003/0068432 A1 | 4/2003 | Dai et al. | |
| 2003/0190278 A1 | 10/2003 | Wang et al. | |
| 2004/0004212 A1 | 1/2004 | Crespi et al. | |
| 2004/0110003 A1 | 6/2004 | Cumings et al. | |

(Continued)

FOREIGN PATENT DOCUMENTS

JP 2003-102472 A * 4/2003

OTHER PUBLICATIONS

Lee et al. (Electromodulated Molecular Transport in Gold-Nanotube membranes, J. Am. Chem. Soc. 2002, 124, 11850-11851).*

(Continued)

*Primary Examiner*—Alex Noguerola
(74) *Attorney, Agent, or Firm*—Knobbe, Martens, Olson & Bear, LLP (57) ABSTRACT

A mass transport method and device for individually delivering chargeable atoms or molecules from source particles is disclosed. It comprises a channel; at least one source particle of chargeable material fixed to the surface of the channel at a position along its length; a means of heating the channel; and a means for applying an controllable electric field along the channel, whereby the device transports the atoms or molecules along the channel in response to applied electric field. In a preferred embodiment, the mass transport device will comprise a multiwalled carbon nanotube (MWNT), although other one dimensional structures may also be used. The MWNT or other structure acts as a channel for individual or small collections of atoms due to the atomic smoothness of the material. Also preferred is a source particle of a metal such as indium. The particles move by dissociation into small units, in some cases, individual atoms. The particles are preferably less than 100 nm in size.

19 Claims, 4 Drawing Sheets

U.S. PATENT DOCUMENTS

2004/0239210 A1    12/2004    Pinkerton et al.
2005/0017598 A1    1/2005    Zettl et al.

OTHER PUBLICATIONS

Pennathur et al. (ElectrokineticTransport in Nanochannels. 1. Theory, Analytical Chemistry, vol. 77, No. 21, Nov. 1, 2005).*

JPO English language translation of JP 2003-102472 A, published Apr. 8, 2003 (Osamu et al.).*

Cho, S. K. et al., "Creating, transporting, cutting and merging liquid droplets by electrowetting-based actuation for digital microfluidic circuits," J. Microelectro. Systems, Feb. 2003, pp. 70-80, vol. 12(1).

Choi, H. C. et al., "Spontaneous reduction of metal ions on the sidewalls of carbon nanotubes," J. Am. Chem. Soc., May 2002, pp. 9058-9059, vol. 124(31).

Gao, Y. et al., "Temperature measurement using a gallium-filled carbon nanotube nanothermometer," Appl. Phys. Lett., Oct. 2003, pp. 2913-2915.

Hafner, J. et al., "Growth of nanotubes for probe microscopy tips," Nature, Apr. 1999 pp. 761-762, vol. 398.

Freemantile, M. et al., "Polymer oled efficiency boost," C & EN, May 2004, p. 9.

Kim, P. et al., "Thermal transport measurements of individual multiwalled nanotubes," The American Phys. Soc., Nov. 2001, pp. 215502-1-215502-4, vol. 87(2).

Koch, C. et al., "Modelling of HREM and nanodiffraction for dislocation kinks and core reconstruction," J. Phys., Sep. 2000, pp. 10175-10183.

Park, H. et al., "Fabrication of metallic electrodes with nanometer separation by electromigration," Appl. Phys. Lett., Jul. 1999, pp. 301-303, vol. 75(2).

Regan, B.C. et al., "Carbon nanotubes as nanoscale mass conveyors," Nature, Apr. 2004, pp. 924-927, vol. 428.

Regan, B.C. et al., "Nanowicks: Nanotubes as Tracks for Mass Transfer," Am. Ins. of Physics Conference Proceedings 685(1), Oct. 2003, pp. 612-615.

Syms, R.R.A. et al., "Surface tension-powered self-assembly of microstructures—the state-of-the-art," J. Microelecto. Systems, Aug. 2003, pp. 387-417, vol. 12(4).

Teo, K.B.K. et al., "Fabrication and electrical characteristics of carbon nanotube-based microcathodes for use in a parallel electron-beam lithography system," J. Vac. Sci. Technol. Mar./Apr. 2003, pp. 693-697, vol. 21(2).

Tseng, Y. et al., "Monolithic integration of carbon nanotube devices with silicon MOS technology," Nano Lett., 2004, pp. 123-127, vol. 4(1).

Regan, B.C. et al., "Nanowicks: nanotubes as templates for mass transfer," ABSTRACT, #N26.008, published by American Physical Society in late 2003.

International Search Report and Written Opinion of the International Searching Authority received in Intl. Appln. No. PCT/US05/09489, mailed Feb. 13, 2007.

CD of a Video presentation given at Mar. 2003 APS meeting, presented by Brian C. Regan.

* cited by examiner

NANOSCALE MASS CONVEYORS

CROSS-REFERENCE TO RELATED APPLICATIONS

This application claims priority to Provisional Patent Application Ser. No. 60/555,458, filed Mar. 22, 2004 and to Provisional Patent Application Ser. No. 60/560,492, filed Apr. 7, 2004. Both applications are hereby incorporated by reference into this application.

STATEMENT OF GOVERNMENTAL SUPPORT

This invention was made during work supported by U.S. Department of Energy under Contract No. DE-AC03-76SF00098. The government has certain rights in this invention.

REFERENCE TO SEQUENCE LISTING OR COMPACT DISK

NONE

BACKGROUND OF THE INVENTION

1. Field of the Invention

The present invention relates to the field of small-scale mass transport, and the application of a voltage differential to controllably move atoms along a prescribed channel.

2. Related Art

Nanotechnology has been proposed previously for atomic scale assembly.[1] Impressive nanofabrication capabilities have been demonstrated with scanning probe manipulation of atoms[2-5] and molecules[4,6] on clean surfaces. However, as fabrication tools, both scanning tunneling and atomic force microscopes suffer from a loading deficiency: while they can manipulate atoms already present, they cannot efficiently deliver atoms to the work area. Carbon nanotubes, with their hollow-cores and large aspect ratios, have been suggested[7,8] as possible conduits for nanoscale amounts of material. Already much effort has been devoted to the filling of nanotubes[8-11] and applications thereof.[12,13] Furthermore, carbon nanotubes have been used as probes in scanning probe microscopy.[14-16] If the atomic placement and manipulation capability already demonstrated by scanning probe microscopy could be combined with a nanotube delivery system, a formidable nanoassembly tool would result.

The present invention is also related to electromigration, a phenomenon of critical importance to the semiconductor industry.[17,18] Electromigration causes failure of metallic components of highly-integrated electronic circuits.

BRIEF SUMMARY OF THE INVENTION

The present invention relates to a mass transport device for delivering individual atoms or molecules to a predetermined location, comprising: (a) a channel which is atomically smooth to permit mass transport at an atomic level; (b) at least one source of chargeable atoms fixed to a surface of the channel at a position along its length; (c) optional means for heating the channel sufficiently to ensure that the atoms can freely migrate from an arrayed particle; and (d) an electrode operatively coupled to one end of the channel with a nearby counter-electrode, operatively coupled on another side of the particle, perhaps attached to the other end of the channel, with both electrodes adapted to be attached to a controllable voltage source, whereby the device transports the atoms along the channel towards or away from the counter-electrode in response to applied voltage.

The present channel may have a diameter (or width) less than 200 nanometers and a length at least ten times its width (a condition referred to as "quasi-one dimensional," in that the aspect of length greatly exceeds width). The channel is preferably a nanotube (single or multiwalled), nanorod, wire, or a quasi-one dimensional path on a two-dimensional surface that is defined by chemical or physical means (i.e. by treating the surface to create a barrier to unconstrained two-dimensional surface diffusion). It may be positionable in order to deliver particles to a predetermined point on or adjacent to the channel.

The present channel further has at least one, preferably a dispersed coating of particles, upon it. Those particles contain the transport species, i.e. chargeable atoms or molecules to be delivered. The channel is preferably made to conduct a current from an electrode that comprises the tip of a microscopic manipulation stage.

The channel may exhibit optimum properties with a length between 10 microns and 10 nanometers and a diameter between 0.5 nm and 100 nm. As is known in the art, carbon nanotubes may alternatively have diameters of 3-10 nm and lengths up to 200 nm. In order to cause mass transport along the channel, it is necessary that the channel be sufficiently warm to permit atomic movement, and that an electric field can be applied to it to drive atomic movement. In the case where these two requirements are simultaneously achieved by establishing a current through the channel (the applied voltage establishes the both the electric field and the heating, which is caused by the current in channel), it is preferred that the channel be capable of carrying a current of more than 20 microamperes. It is also preferred that the material to be transported have a low vapor pressure near its melting point, otherwise material might be lost. The particles which provide the transport material are preferably comprised of a metal such as indium, thallium, gallium, tin, titanium, lead, mercury, gold, silver, aluminum, platinum, copper, iron, cobalt, nickel, or mixtures thereof. The particles may also comprise chargeable organic molecules, polymers, amino acids, peptides or carbohydrates.

DETAILED DESCRIPTION OF THE PREFERRED EMBODIMENT

Definitions

The term "channel" is used herein in its most general sense, as a solid support along or through which material may flow. It is used here on a nano scale, and is intended to cover nanotubes (single or multiwalled, made of various materials such as carbon or boron nitride), nanorods, nanowires, quasi-one dimensional paths on two-dimensional surfaces that are defined by electrical, chemical or physical means (i.e. by treating the surface to create a barrier to unconstrained two-dimensional surface diffusion), and the like.

The channel is essentially atomically smooth, as that term is understood in the field of material science. As used herein, and generally understood, "atomically smooth" means lacking in contaminants, imperfections or other barriers, cavities or defects that disrupt an ordered atomic structure that would provide an extremely smooth surface. A discussion of atomic smoothness is found in Koch et al., "Modelling of HREM and nanodiffraction for dislocation kinks and core reconstruction," J. Phys.: Condens. Matter 12:10175-10183 (2000). The term "atomically smooth" refers, in the context of the present device, to the ability of a channel in a device according to the present invention to transport atoms along the channel, without the atoms (or clusters of atoms) being lost, diverted, or stuck on the channel.

The term "chargeable" means that a material exhibits physical motion in response to an applied voltage. A "chargeable" atom may be ferromagnetic, metallic, or a biological molecule capable of exhibiting charged behavior (e.g. migration though an electrophoretic gel). The property of being "chargeable" is exemplified by metals such as indium, thallium gallium, tin, titanium, lead, mercury, gold, silver, aluminum, platinum or copper, or alloys containing these metals. Biological molecules such as DNA, organic molecules, polymers, amino acids, peptides, carbohydrates and proteins also exemplify this property, as evidenced by their migration in gel electrophoresis.

The term "ferromagnetic" means noting or pertaining to a substance, as iron, that below a certain temperature, the Curie point, can possess magnetization in the absence of an external magnetic field; noting or pertaining to a substance in which the magnetic moments of the atoms are aligned.

The term "atoms" is used in its most general sense to refers to atoms, molecules, or clusters of less than 10 atoms or molecules. "Atoms" to be transported are supplied by a "source" particle, which may contain many millions of "atoms".

The source particles of atoms in the present invention are between 1 and 10,000 nm in diameter, preferably between 5 and 500 nm in diameter, most preferably between 5 and 100 nm in diameter (width), and are comprised of atoms that are chargeable so as to be moveable in response to an electric field.

By "mass transport," it is meant that the device works by moving atoms at a very small scale, mostly individually (as in surface diffusion), rather than in group (as in a droplet or stream that moves according to the laws of hydrodynamic flow). Because of the chargeable properties of the atoms used, the mass transport moves atoms along the channel away from the electrode and towards the counter electrode according to the combination of the channel temperature and the applied electric field. Sufficiently high temperature is required to make the atoms mobile, and the electric field (generated by the applied voltage) is required to direct the motion of the atoms one way or the other along the channel.

Generalized Method and Apparatus

The preferred channel is a multiwalled carbon nanotube (MWNT). These nanotubes have a near perfect carbon tubule structure that resembles a sheet of sp3 bonded carbon atoms rolled into a seamless tube. They are generally produced by one of three techniques, namely electric arc discharge, laser ablation and chemical vapor deposition. The arc discharge technique involves the generation of an electric arc between two graphite electrodes, one of which is usually filled with a catalyst metal powder (e.g. iron, nickel, cobalt), in a helium atmosphere. The laser ablation method uses a laser to evaporate a graphite target which is usually filled with a catalyst metal powder too. The arc discharge and laser ablation techniques tend to produce an ensemble of carbonaceous material which contain nanotubes (30-70%), amorphous carbon and carbon particles (usually closed-caged ones). The nanotubes must then be extracted by some form of purification process before being manipulated into place for specific applications. The chemical vapor deposition process utilizes nanoparticles of metal catalyst to react with a hydrocarbon gas at temperatures of 500-900° C. A variant of this is plasma enhanced chemical vapor deposition in which vertically aligned carbon nanotubes can easily be grown. In these chemical vapor deposition processes, the catalyst decomposes the hydrocarbon gas to produce carbon and hydrogen. The carbon dissolves into the particle and precipitates out from its circumference as the carbon nanotube. Thus, the catalyst acts as a 'template' from which the carbon nanotube is formed, and by controlling the catalyst size and reaction time, one can easily tailor the nanotube diameter and length respectively to suit. Carbon tubes, in contrast to a solid carbon filament, will tend to form when the catalyst particle is ~50 nm or less because if a filament of graphitic sheets were to form, it would contain an enormous percentage of 'edge' atoms in the structure.

Other forms of nanotube may be used, so long as they have uniform mechanical properties and are chemically inert to the atoms that are to be transported. For example, BC2N or BN nanotubes, as described in Zettl, "Non-Carbon Nanotubes," Adv. Mat. 8(5):443-445 (1996). Nanotubes in the general sense of a channel may be formed intrinsically within a substrate by known techniques to cause an atomic ordering of atoms (e.g. carbon, silicon, boron) within the substrate to define a graphite-like ordered structures regularly covalently bonded as in the MWNT $sp^3$ structure.

In addition, the present channels may be nanotubes that have been covalently modified to contain other atoms. The present channels may comprise a platinum nanowire, as described, for example, in Xia et al. J. Am. Chem. Soc. Published online Aug. 17, 2004, http://dx.doi.org/10.1021/ja0446224. The nanotube channel may be filled with a conductive filler, as described for example in Gao et al. US PUB 2002/0004135, published Jan. 10, 2002, hereby incorporated by reference. The nanotube channel may be adapted to pass current between two conductive elements as described in Dai et al. US PUB 2002/0179434, published Dec. 5, 2002, hereby incorporated by reference, or disposed on a silicon substrate for providing electrical contacts, as described for example in Dai et al. US PUB 2003/0068432, published Apr. 10, 2003, hereby incorporated by reference.

The channel may also be a carbon nanostructure formed within a substrate. That is, the presently disclosed nanotubes, nanowires, nanofibers, etc. may be formed within a substrate. U.S. Pat. No. 5,413,866 to Baker et al. teaches carbon nanostructures characterized as having: (i) a surface area from about 50 m2/g to 800 m2/g; (ii) an electrical resistivity from about 0.3 .mu.ohm.multidot to 0.8 .mu.ohm.multidot.m; (iii) a crystallinity from about 5% to about 100%; (iv) a length from about 1 .mu.m to about 100 .mu.m; and (v) a shape that is selected from the group consisting of branched, spiral, and helical. These carbon nanostructures are taught as being prepared by depositing a catalyst containing at least one Group IB metal and at least one other metal on a suitable refractory support, then subjecting the catalyst-treated support to a carbon-containing gas at a temperature from the decomposition temperature of the carbon-containing gas to the deactivation temperature of the catalyst. U.S. Pat. No. 5,458,784 also to Baker et al. teaches the use of the carbon nanostructures of U.S. Pat. No. 5,413,866 for removing contaminants from aqueous and gaseous steams; and U.S. Pat. Nos. 5,653,951 and 6,159,538 to Rodriguez et al. disclose and claim methods of incorporating hydrogen into layered nanostructure materials characterized as having: (i) crystalline regions; (ii) interstices within the crystalline regions which interstices are from about 0.335 nm to 0.67 nm, and (iii) surfaces of said nanostructure which define the interstices, which surfaces have chemisorption properties with respect to hydrogen. All of the above referenced U.S. patents are incorporated herein by reference.

The electrodes are operatively coupled to the device in the vicinity of channel on either side of the source particle, but need not be physically attached to the channel in certain embodiments. That is, an electric field sufficient to drive atomic movement may be generated in the medium surrounding the channel (e.g. air), and the channel may be heated by means other than the electrode(s). In the exemplified embodiment, one electrode is in fact at the end of the nanotube, and the other electrode is brought into contact with a tip of a nanotube with a finely adjustable manipulator.

EXAMPLES

Example 1

Preparation of Mass Transport Apparatus

A sample of multiwalled carbon nanotubes (MWNTs) was first prepared as follows: an electric arc was established between graphite electrodes in a rarified atmosphere. The resulting boule was cross-sectioned, and fibers with high nanotube content were extracted with tweezers. Individual fibers were glued to Pt/Ir wire with (conducting) silver paint for mounting on the manipulation stage.

Next, indium metal was thermally evaporated ex situ onto the above-prepared MWNT so as to decorate the nanotubes with isolated indium nanocrystals. This was done in the following apparatus under the following conditions: The nanotubes sample was mounted in a thermal evaporator, and the evaporation chamber was evacuated to a pressure of 2 microtorr or less. Indium metal of better than 99% purity was then thermally evaporated onto the sample. The amount of indium metal evaporated corresponded to a uniform thickness of 25 nm, as determined by an in situ crystal thickness monitor. However, because of the wetting properties of indium on MWNTs, the morphology of the indium film was that of discrete particles rather than a layer with continuous coverage.

The coated sample was then fixed to the sample side of the TEM stage.

Example 2

Electrode Activation and Operation

The nanotube assembly was prepared inside a JEOL-2010 transmission electron microscope (TEM) equipped with a piezo-driven nanomanipulation stage (JEOL-USA, Inc., Peabody Mass.). Inside the TEM, under high vacuum conditions, an individual nanotube or bundle was approached with a freshly-etched tungsten tip mounted on the nanomanipulator, and physical contact was made between the tip and the free end of the nanotube. Applying voltage between the tip and the sample holder establishes an electrical circuit through the subject tube, and injects thermal energy into the system via Joule heating. By increasing the applied voltage, the local temperature can be easily elevated past the melting point of the indium particles decorating the tube. Further manipulation of the voltage produces dramatic mass transport between these nanoparticles, which serve as mass reservoirs. The transport process was recorded using real-time TEM video imaging.

An amperage between 0.1 and 500 μA was conducted through the nanotube by electrical connections through the tungsten tip at one end and the substrate upon which the MWNT was disposed at the other end.

Figure 1A:
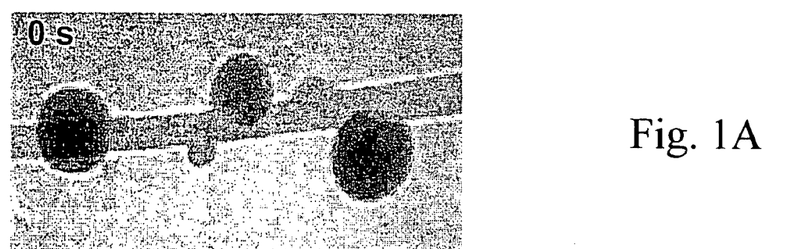
FIG. 1A-D is series of video frames from an electron micrograph showing indium spheres at discrete points on a multiwalled carbon nanotubes at 0, 60, 120 and 180 seconds, respectively.
Figure 1B:
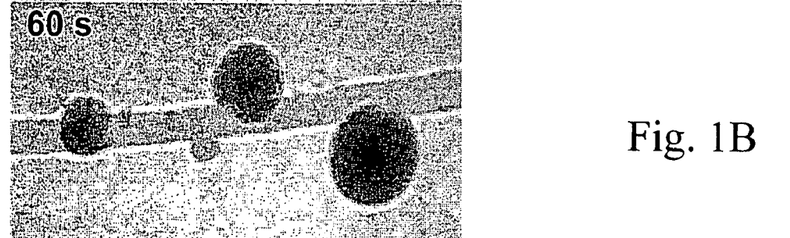
Figure 1C:
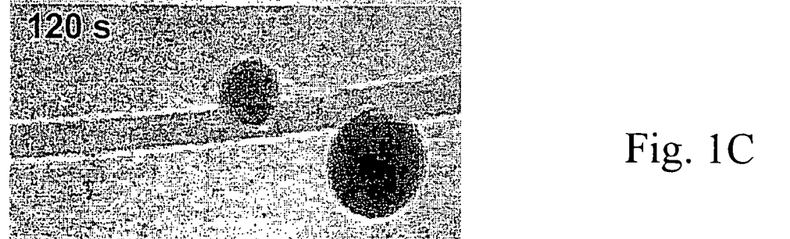
Figure 1D:
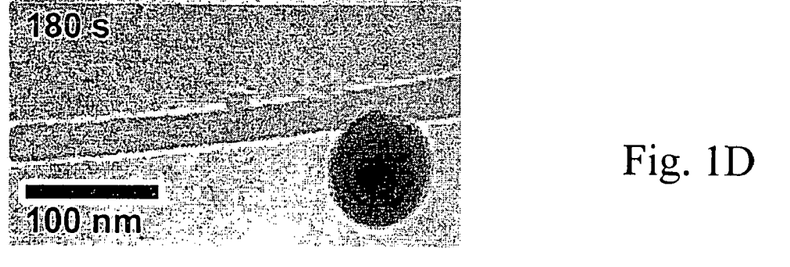

FIG. 1A-D gives a series of video frames illustrating the transport process. FIG. 1 was taken from four TEM video images, spaced by one minute increments, showing left-to-right indium transport on a single MWNT. The tip (anode) was out of view to the left and the sample electrode (cathode) is out of view to the right. The measured circuit resistance is ~49 kohms most of which is presumably concentrated at the tip-MWNT contact. A single MWNT, clean except for resident indium particles, spans the images from left to right. During the three minute period shown ~40 μA are passing through the MWNT. The first frame of FIG. 1 shows three large indium particles, separated by about 100 nm, and several smaller ones. The dark contrast and nearly round shapes indicate that the particles are molten. As the experiment proceeds, particles to the left are generally getting smaller, while those to the right grow. Tracking the central large particle in particular, it is seen to grows between the first and second frames(FIGS. 1A, 1B)—while there are still particles to its left—but shrinks thereafter (FIGS. 1C, 1D). Qualitative inspection suggests a near unity correlation between mass losses on the left and mass gains to the right.

Figure 2:
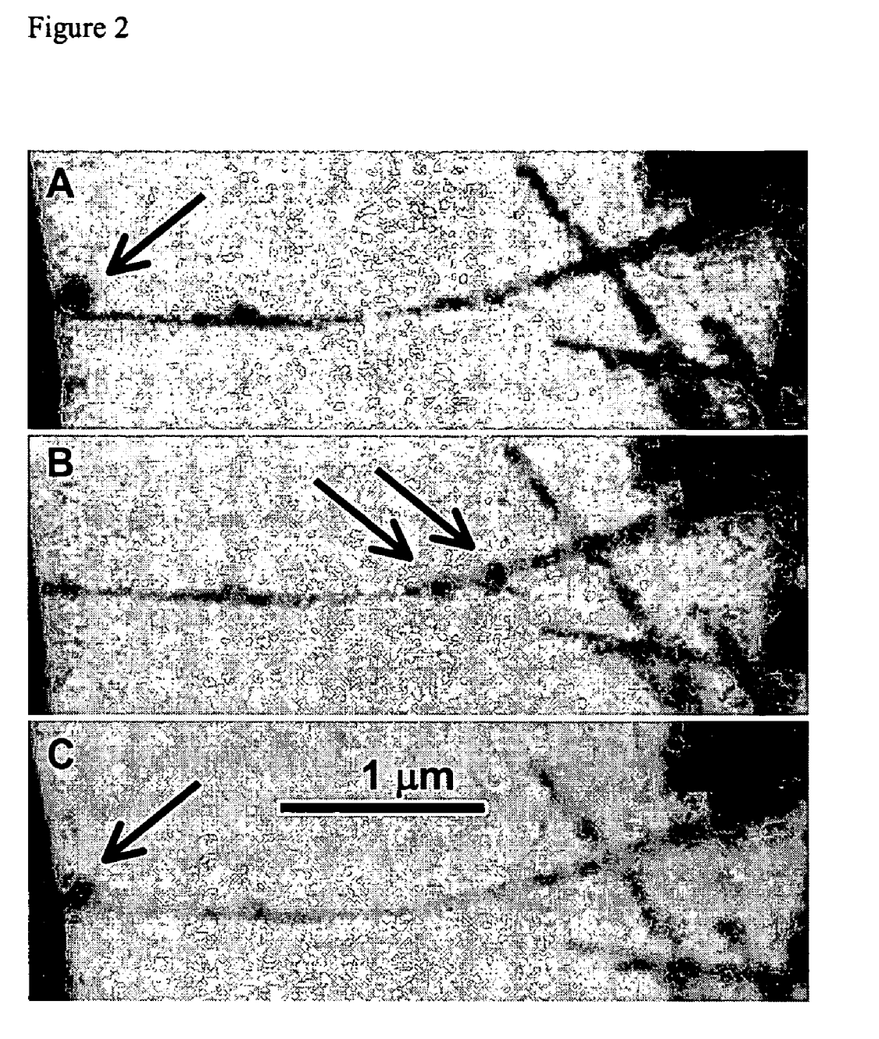
FIG. 2A-C is a series of video frames from an electron micrograph showing indium spheres on a multiwalled carbon nanotube touching a tungsten tip at the left, center and right of the frame, respectively.

The same transport process demonstrated in FIG. 1 can occur over a much larger length scale, as shown in FIG. 2. FIG. 2A-C represents a time series of three TEM video images showing reversible indium transport over a distance of more than two microns. By applying appropriate current to the carbon nanotube pictured, indium was moved from left (A) to right (B), and back again (C). Arrows identify the relevant particles.

Here the tungsten tip is visible at the extreme left of the images and the sample boule with protruding, indium-decorated MWNTs is on the far right. Spanning the tip-boule gap is a MWNT bundle 3.3 μm long. FIG. 2A shows a round indium particle on the subject bundle near the tip. Applying 1.8 V between the tip and sample holder drives ~50 μA through the bundle, with the result is shown in FIG. 2B: the particle near the tip has disappeared, and over 2 μm away two new indium particles have appeared.

It was demonstrated that it is not a temperature gradient that drives the mass transport along the nanotubes. In FIG. 1, and FIGS. 2A and 2B, the presumed high resistance point, or "hot spot", is on the left side of the images. Thus in these figures mass is consistently moving towards cooler locales. To test this hypothesis, the direction of the supplied current was reversed, which, by virtue of Joule heating $I^2R$, maintains the same temperature gradient. FIG. 2C shows the result: the two new particles vanish, and the original particle near the tip reappears, growing to its original size (shown in FIG. 2A). Thus the voltage gradient, rather than the thermal gradient, determines the direction of mass transport. The atoms to be transported will therefore move in response to the voltage gradient and rapidly respond to changes in the gradient. The temperature is only important to impart a degree of mobility to the atoms to be transported. The atoms to be transported, however, do not have to be in a liquid state. The atoms (and thereby the particles) are moved by the electromotive force of the voltage gradient along the channel.

Applying an automated image processing routine of the inventors' own design, using National Instrument's Vision Builder program, to the video data from such experiments, extracted particle areas were extracted, and, approximating the particles as spheres, thereby determined their masses quantitatively (mass=$(7 \text{ g/cm}^3)(4\pi/3)(\text{area}/\pi)^{3/2}$). This showed that total indium mass is conserved to a high degree of accuracy (±5%) during the transport process. Indeed, apparent lack of mass conservation invariably originates from failure to use a wide enough field of view, i.e. to include all the participating particles.

Since both the rate and direction of mass transport depend on the external electrical drive, precise control of a mass distribution is possible.

Example 3

Figure 3:
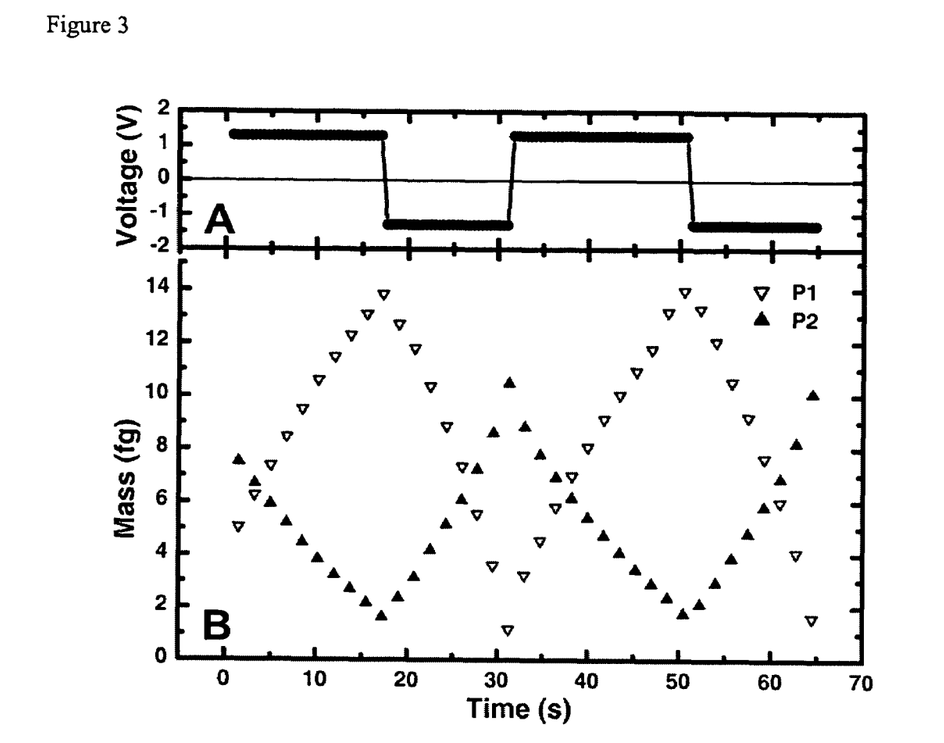
FIG. 3 is a graph showing voltage (3A) and mass transport (3B)

Mass Transfer as a Function of Voltage (FIG. 3)

FIG. 3 is a graph showing controllable, reversible indium transport. Panel (A) shows control voltage (±1.3 V) as a function of time. Panel (B) shows particle masses as a function of time. On the MWNT bundle Particle 1 (P1) is located nearer the tip than Particle 2 (P2).

Panel A shows voltage as a square function between approximately +1.3V and −1.3V. The frequency is about 15 sec at the negative voltage and about 15 seconds at the positive voltage. In actual operation, the voltage and times were maintained at moderate values in order to facilitate observation of the opposite directions of mass transfer. However, frequencies up to and beyond one megahertz should be possible in conjunction with suitable diagnostics. At higher frequencies, a particle can be made to rapidly change size. Mass transfer rates are limited by the diffusion constant of the particles on the channel. This constant can be increased by raising the temperature (until the mass loss to evaporation becomes unacceptable) or increasing the electric field (until the high voltage or electrical breakdown becomes a limiting factor).

Two indium particles are illustrated in FIG. 3B by downward pointing triangles P1 and upward pointing triangles P2 (solid). The particles are on the order of 1 to $10^8$ atoms. The mass of particle 1 increases from about 5 fg to about 14 fg, then drops to approximately 1 fg in a function that tracks the voltage changes, namely under positive voltage the particle grows because it is receiving material from particle 2. Particle P2 shows opposite effects because it is exchanging mass with particle 1.

FIG. 3 thus illustrates how two indium particles on a MWNT bundle (P1 and P2) alternately grow and shrink as they exchange mass in response to a square-wave forcing function. The direction of indium transport is again towards the cathode. Although square-wave control is shown here for simplicity's sake, the mass transfer rate can be regulated to any desired level by adjusting the voltage. Because of the high thermal conductivity of the nanotube, driving the voltage to zero rapidly quenches the mass transport. Mass can be delivered, in principle atom-by-atom, until a final, pre-selected particle size is achieved. This has obvious important consequences for tailoring nanoscale mass distributions for, e.g. optical, electronic, or mechanical applications. By delivering material to its end, it is possible to use the nanotube as a "nano soldering iron."

Delivery to a particular, predetermined point may be accomplished by providing the channel/nanotube with a defect at a predetermined point that will serve as a nucleation site for atoms being transported. The nucleation site may be introduced in the channel by heating the channel to change the defect structure (i.e. disrupting an atomically smooth surface. Chemical or electrical means can also be used to introduce a defect into the channel. Irradiation with an electron beam can be applied to a specific spot where atoms are to be delivered. Chemicals, or oxidation may be applied to create a nucleation site. Alternatively, a material can be added to the channel a the desired nucleation site. A suitable refractory material to initiate nucleation of a particle would be a metal oxide.

While the inventors do not wish to be bound by any one theory of operation of the present device, one illustrative model shows that indium atoms move between particles as the constituents of a two-dimensional gas on the surface of the nanotube. At a given temperature an indium particle maintains an equilibrium indium surface concentration on the host nanotube at its attachment point. On the nanotube the metal atoms move in a thermally-activated diffusion process, but with an important directional bias supplied by the applied electric field. Thus the electric field can shift the surface concentration of indium above or below the thermodynamic equilibrium point at a given site, and thereby dictate whether a particle at that site will grow or shrink. Likewise, nearby particles, which act as mass sources and sinks, influence the fate of a particle at a given location.

Example 4

Mass Transport as Function of Particle Size Change Observed by TEM

Figure 4:
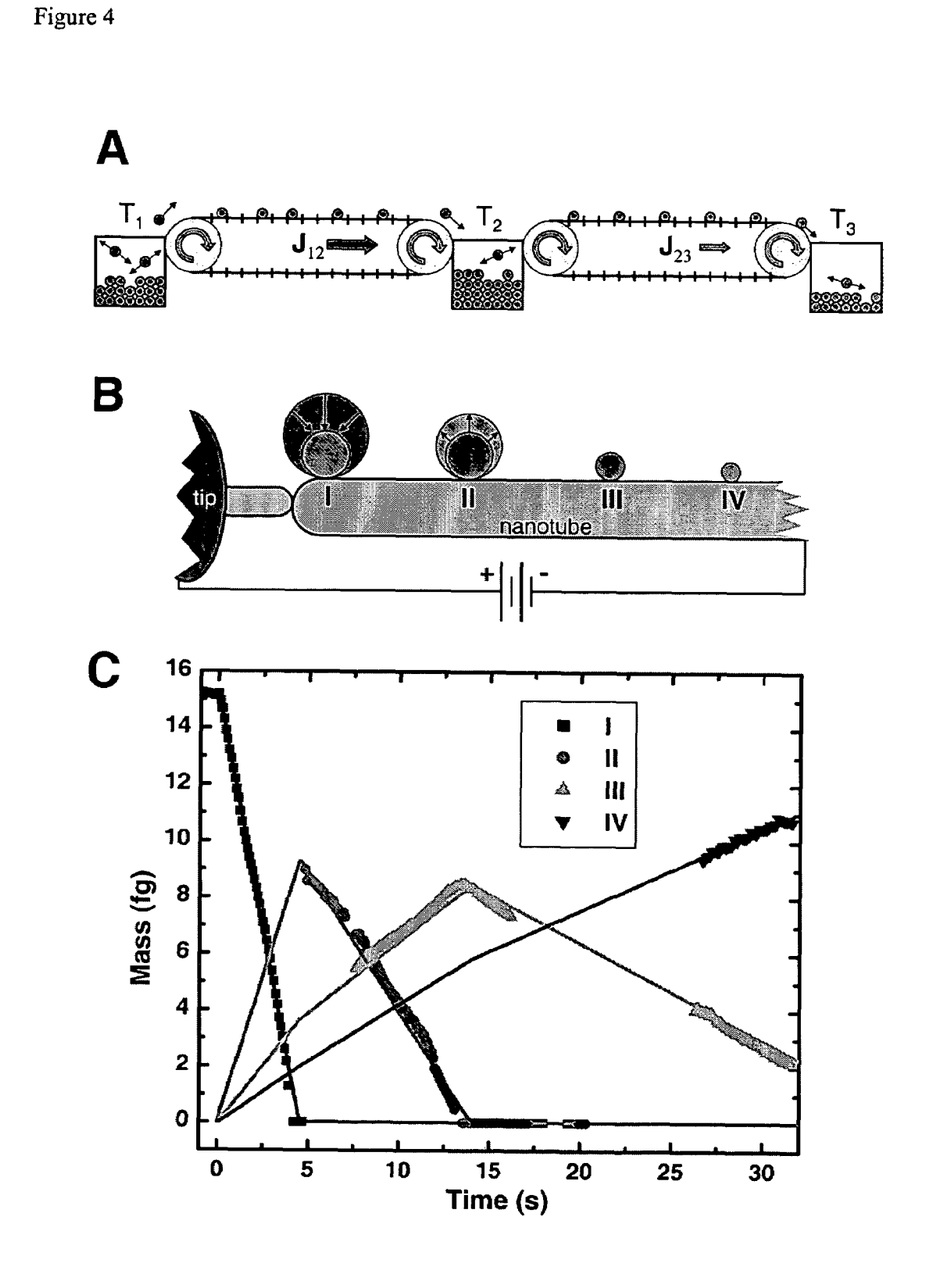
FIG. 4A is a schematic illustration of a conveyor analogy of the present mass transport.
FIG. 4B is a sketch of the structures shown by microscopy.
FIG. 4C is a graph of mass versus time for the structures shown in FIG. 4B.

Reservoir-to-reservoir transport at constant applied power is illustrated in cartoon FIGS. 4(A) and 4(B) and a graph of actual data, FIG. 4(C). In 4(A), there is shown a conveyor analogy for the transport process. The three mass reservoirs are in a temperature gradient, with $T_1 > T_2 > T_3$. The conveyors carry mass with throughput J, expressed in units of mass per time. Since $J_{12}$ is larger than $J_{23}$, when the transport direction is as shown the second reservoir will accumulate mass until the first is emptied. When the transport direction is reversed the second reservoir will lose mass regardless of the condition of its neighbors. 4(B) is a schematic depiction of the experimental setup. Four indium particles distributed on a nanotube substrate grow and shrink as current is passed from the tungsten tip through the substrate. On the left is a very fine tungsten tip, manipulated inside a TEM to contact a nanotube. The nanotube extends to the right, to the sample holder. A voltage is applied as shown and the particles would then move from left to right (towards the cathode). Graph 4(C) shows particle masses as a function of time. Experimentally-determined masses of the four particles are indicated with the symbols shown in the legend. The solid curves are produced by a model that assumes constant mass transfer rates and mass conservation.

FIG. 4A represents another model for understanding the present mass transport system is shown in an analogy. Mass reservoirs, representing indium particles at local temperature $T_i$ ($T_1$ $T_2$ and $T_3$), are connected by mass conveyors $J_{12}$ and $J_{23}$. Each conveyor moves mass at a fixed rate $J_{ij}$ that is a function of electric field and temperature. Conveyors nearer the hot spot move mass more rapidly. The "hot spot" is the point of high resistance. In this implementation, the heating and the electric field necessary to move the atoms are both supplied by the applied voltage. The voltage between the sample electrode and the tip electrode creates the electric field. Since there is a complete electric circuit through the channel, this voltage also drives an electric current. Resistance in the circuit creates Joule heating, concentrated in the points with the highest resistance. If, for instance, the electrical contact between the nanotubes and the experimentally used moveable tungsten tip is poor, there will be a high resistance and thus a large amount of local heat dissipation there—hence the term "hot spot". Note that in an alternative implementation another source of heating could be supplied, such as radiative, microwave, or other resistive heating. In such a case it would be sufficient to establish a voltage differential along the channel to effect mass transport. Driving an electrical current through the channel would not be required. Thus it is possible to use channels that are electrically insulating.

If mass is moving down a temperature gradient, an intermediate reservoir will fill as its source conveyor provides mass faster than its drain conveyor takes it away. Once the upstream reservoir is exhausted, the intermediate reservoir will begin to empty at the rate set by its drain conveyor. Since an atom might diffuse past a particle without joining it, at each reservoir this also allows for a "bypass" probability (bypasses are not depicted in FIG. 4A).

FIG. 4B schematically depicts an experiment, similar to those presented above, that demonstrates the utility of the mass conveyor model. A tip extension touches a small nanotube bundle that subsequently supports indium particles at four different positions I-IV. Initially the indium is concentrated in Particle I. The tip voltage is ramped to 1.7 V relative to the sample boule and mass begins moving from left to right, as particles closer to the sample electrode grow at the expense of those near the tip. After the voltage ramp the applied power is consistently ~45 µW. A video taken of particles moving in this manner shows them shrinking and growing in the manner described.

Referring now to FIG. 4C, a graph of mass vs. time is shown for sample particles (e.g. indium) arrayed along a nanotube at a given time in the transfer process. Using the mass-determination routine described in connection with Example2, a mass vs. time plot has been generated for Particles I-IV as shown in FIG. 4B, again corresponding to observed results. The relevant data are shown as discrete symbols and labeled I through IV corresponding to particles I-IV from left to right in FIG. 4B. Gaps in the data occur because the TEM data video was taken at high magnification where the field of view is large enough to contain only one or two particle positions simultaneously. Despite its fragmentary nature, the data set is quite revealing. For example, the curves are constructed of remarkably linear segments. The constancy of these mass change rates suggests that surface energies, which vary with particle radius,[22] are not playing a significant role in driving the transport process, down to at least the femtogram level (1 fg indium≲5 million atoms≲30 nm radius sphere). Similarly, indium concentrations only affect transfer rates in a binary sense: the presence or absence of a particle, but not its size, influences the growth of its neighbors. Thus the disappearance of Particle II near time t=14 s changes the growth rate of Particle III from a positive value to a negative one, but its slow diminution has no effect.

To compare the predictions of the mass conveyor model to the experimental data of FIG. 4C, seven non-zero input parameters are required. Four of these parameters are determined by linear fits on appropriate sections of the data: the initial mass of Particle I and the mass loss rates of Particles I, II, and III. The remaining three inputs (bypass probabilities for Particles II, III, and IV) are set by least squares minimization. Other aspects of the curves, e.g. growth rates, axis intercepts and turnover points, then follow directly from mass conservation. The solid lines in FIG. 4C are the predictions of the mass conveyor model with these inputs. The agreement between the model curves and the data is excellent. Kinks are predicted in the particle growth rates whenever another particle is exhausted, as seen in the mass curve of Particle III at t=5 s and dramatically at t=14 s. Furthermore, the fits reveal that the probability for bypassing a particle in this system is small, as the best values are 11, 14, and 15% for Particles II, III, and IV respectively.

The conveyor analogy also anticipates the behavior of this multi-reservoir system upon reversal of the applied voltage. When the voltage is reversed, the conveyors move mass in the opposite direction. However, since the temperature gradients do not change, conveyors nearer the tip continue to have higher throughput. Thus no intermediate particles will grow, as they are drained faster than they fill. Similarly, particles nearer the tip disappear faster than their more remote neighbors. When the voltage is reversed in video S1, exactly these behaviors are observed. Particle III disappears before Particle IV, and the mass re-condenses near the initial position of Particle I.

The existence of preferred locations for particle growth, observed under a variety of substrate conditions, raises interesting issues. Particle growth is most reproducible at locations with seed indium, but regeneration also occurs where all the indium has been driven off. Such nucleation sites may be anchored by either refractory debris, such as indium oxide, or point defects intrinsic to the nanotube. Defects are relatively uncommon in these arc-grown MWCNTs, and thus are unlikely to be creating a contiguous preferred path on the nanotube surface. Interlayer transport of the indium through the carbon nanotubes can be ruled out, given that the intercalation of high quality MWCNTs requires serious degradation of their structural integrity.[23] (Nanotubes' resistance to hoop stress makes them much more difficult to intercalate than graphite.) It would be of interest to determine the indium concentration along the nanotubes during the transport process, for example using a TEM with analytical capability. The experimentally used nanomanipulation stage is not configured for an analytical TEM, and thus an alternative design, based on the presently explained principles would be needed for such a determination.

Despite the successes of the model, questions remain about the exact nature of the driving mechanism. The data presented here establish that surface energies, which cause Ostwald ripening,[24] and thermal gradients, which drive thermomigration,[25] are of subordinate importance to electromagnetic forces. Various authors have considered coupling between external species and electrical currents in carbon nanotubes.[26-28] Identifying the electric field as the most promising candidate driver allows useful comparisons with the known physics of electromigration. Within an electromigration paradigm, electron transfer from the indium atoms to the substrate nanotubes accounts for the observed transport direction. Thus the "direct" force from the electric field prevails over the "wind" force created by momentum exchange with the charge carriers. While indium electromigrates towards the anode in bulk, it moves towards the cathode on silicon surfaces,[29,30] which are perhaps more analogous. Given the teachings of the present specification, the direction of migration of an atom charges by the electromagnetic field along the nanotube can be determined by routine experimentation, namely observing the direction of mass transport. Some materials will move towards the cathode, and some towards the anode. The direction of migration will also depend upon what the nanotube or channel is made out of. Within the theory of electromigration this is explained by the direction of the charge donation: if the atom to be transported gives an electron to the channel, it will move towards the cathode (since it is now positively charged). Likewise, if it receives an electron (or more than one, or part of one), it will move towards the anode, since it will not be negatively charged.

In either case, one an move the material in the desired direction by choosing the appropriate electrode/counter-electrode cathode/anode combination.

The present examples, methods, procedures, specific compounds and molecules are meant to exemplify and illustrate the invention and should in no way be seen as limiting the scope of the invention, which is defined by the appended claims. Any patents or publications mentioned in this specification are indicative of levels of those skilled in the art to which the patent pertains and are hereby incorporated by reference to the same extent as if each was specifically and individually incorporated by reference and for the purpose of describing and enabling the method or material referred to.

REFERENCES

1. Service, R. F. Is nanotechnology dangerous? *Science* 290, 1526-1527 (2000).
2. Eigler, D. M. & Schweizer, E. K. Positioning Single Atoms with a Scanning Tunneling Microscope. *Nature* 344, 524-526 (1990).
3. Crommie, M. F., Lutz, C. P. & Eigler, D. M. Confinement of Electrons to Quantum Corrals on a Metal-Surface. *Science* 262, 218-220 (1993).
4. Bartels, L., Meyer, G. & Rieder, K. H. Basic steps of lateral manipulation of single atoms and diatomic clusters with a scanning tunneling microscope tip. *Physical Review Letters* 79, 697-700 (1997).
5. Oyabu, N., Custance, O., Yi, I. S., Sugawara, Y. & Morita, S. Mechanical vertical manipulation of selected single atoms by soft nanoindentation using near contact atomic force microscopy. *Physical Review Letters* 90 (2003).
6. Heinrich, A. J., Lutz, C. P., Gupta, J. A. & Eigler, D. M. Molecule cascades. *Science* 298, 1381-1387 (2002).
7. Kral, P. & Tomanek, D. Laser-driven atomic pump. *Physical Review Letters* 82, 5373-6 (1999).
8. Supple, S. & Quirke, N. Rapid imbibition of fluids in carbon nanotubes. *Physical Review Letters* 90 (2003).
9. Ajayan, P. M. & Iijima, S. Capillarity-Induced Filling of Carbon Nanotubes. *Nature* 361, 333-334 (1993).
10. Dujardin, E., Ebbesen, T. W., Hiura, H. & Tanigaki, K. Capillarity and Wetting of Carbon Nanotubes. *Science* 265, 1850-1852 (1994).
11. Pederson, M. R. & Broughton, J. Q. Nanocapillarity in Fullerene Tubules. *Physical Review Letters* 69, 2689-2692 (1992).
12. Gao, Y. H. & Bando, Y. Carbon nanothermometer containing gallium. *Nature* 415, 599-599 (2002).
13. Ugarte, D., Chatelain, A. & deheer, W. A. Nanocapillarity and chemistry in carbon nanotubes. *Science* 274, 1897-1899 (1996).
14. Wong, S. S., Joselevich, E., Woolley, A. T., Cheung, C. L. & Lieber, C. M. Covalently functionalized nanotubes as nanometre-sized probes in chemistry and biology. *Nature* 394, 52-55 (1998).
15. Wong, S. S., Harper, J. D., Lansbury, P. T. & Lieber, C. M. Carbon nanotube tips: High-resolution probes for imaging biological systems. *Journal of the American Chemical Society* 120, 603-604 (1998).
16. Dai, H. J., Hafner, J. H., Rinzler, A. G., Colbert, D. T. & Smalley, R. E. Nanotubes as nanoprobes in scanning probe microscopy. *Nature* 384, 147-150 (1996).
17. Pierce, D. G. & Brusius, P. G. Electromigration: a review. *Microelectronics & Reliability* 37, 1053-72 (1997).
18. Collins, P. G., Hersam, M., Arnold, M., Martel, R. & Avouris, P. Current saturation and electrical breakdown in multiwalled carbon nanotubes. *Physical Review Letters* 86, 3128-3131 (2001).
19. Nanofactory Instruments AB, Göteborg, Sweden.
20. We have also performed mass transport experiments with Au, Pt, Sn, and Sn—In alloy.
21. Cumings, J. P. *Electrical and Mechanical Properties of Carbon and Boron Nitride Nanotubes* (University of California, Berkeley, Berkeley, 2002).
22. Adamson, A. W. & Gast, A. P. *Physical chemistry of surfaces* (Wiley, New York, 1997).
23. Duclaux, L. Review of the doping of carbon nanotubes (multiwalled and single-walled). *Carbon* 40, 1751-1764 (2002).
24. Zinke-Allmang, M. Phase separation on solid surfaces: nucleation, coarsening and coalescence kinetics. *Thin Solid Films* 346, 1-68 (1999).
25. Hummel, R. E. Electromigration and Related Failure Mechanisms in Integrated-Circuit Interconnects. *International Materials Reviews* 39, 97-111 (1994).
26. Kral, P. & Shapiro, M. Nanotube electron drag in flowing liquids. *Physical Review Letters* 86, 131-4 (2001).
27. Ghosh, S., Sood, A. K. & Kumar, N. Carbon nanotube flow sensors. *Science* 299, 1042-1044 (2003).
28. Mingo, N., Yang, L. & Han, J. Current-induced forces upon atoms adsorbed on conducting carbon nanotubes. *Journal of Physical Chemistry B* 105, 11142-11147 (2001).
29. Yasunaga, H. & Natori, A. Electromigration on Semiconductor Surfaces. *Surface Science Reports* 15, 205-280 (1992).
30. Kono, S., Goto, T., Ogura, Y. & Abukawa, T. Surface electromigration of metals on Si(001): In/Si(001). *Surface Science* 420, 200-212 (1999).

What is claimed is:

1. A mass transport device for delivering atoms from source particles, comprising:
    (a) a channel having an atomically smooth surface;
    (b) at least one source particle fixed to the surface of the channel at a position along its length; and
    (c) an electrode operatively coupled to the channel on one side of the source particle, and a counter electrode operatively coupled to the channel on another side of the source particle, said electrodes being adapted to be attached to a controllable voltage source, wherein the device is configured to reversibly transport the atoms from the source particle along the channel towards one electrode and away from the other in response to the applied voltage.

2. The mass transport device of claim 1 wherein the channel is a multiwalled carbon nanotube.

3. The mass transport device of claim 2 wherein the multiwalled carbon nanotube is produced by an arc discharge method.

4. The mass transport device of claim 1 wherein the channel is a carbon nanostructure formed within a substrate.

5. The mass transport device of claim 1 wherein the channel is a nanotube with a length between 50 and 5000 nanometers and a diameter between 5 nm and 50 nm.

6. The mass transport device of claim 5 wherein the nanotube carries a current of about 20 to 1000 microamperes.

7. The device of claim 1 wherein the source particle is molten metal.

8. The device of claim 1 wherein the source particle comprises indium, thallium gallium, tin, titanium, lead, mercury, gold, silver, aluminum, platinum or copper.

9. A mass transport device for delivering atoms from source particles, comprising:
   (a) a nanotube channel having an atomically smooth surface;
   (c) at least one metal source particle fixed to the surface of the channel at a position along its length; and
   (c) means for providing an electric field operating on the source particle, wherein the device is configured to reversibly transport the atoms from the source particle along the channel in response to the electric field.

10. A method for delivering chargeable atoms to a location on a channel for conducting atoms, said channel operatively coupled to an anode and a cathode for creating a voltage gradient along the channel, comprising:
    (a) providing a channel that has an atomically smooth surface;
    (b) applying at least one chargeable particle smaller than 10 micrometer to a surface of the channel; and
    (c) providing a voltage gradient along a length of the channel sufficient to reversibly transport the particle along the channel in response to the voltage gradient.

11. The method of claim 10 wherein the channel is a multiwalled carbon nanotube (MWNT), a single walled carbon nanotube, a nanowire, or a carbon nanostructure formed within a substrate.

12. The method of claim 11 further comprising the step of applying a charge to a tip of a microscopic manipulation stage to provide said anode end.

13. The method of claim 10 further comprising the step of producing an MWNT by an arc discharge method.

14. The method of claim 10 wherein the channel has a length between 50 and 5,000 nanometers and a diameter between 5 nm and 50 nm.

15. The method of claim 10 wherein said step of providing a voltage results in a current of between 20 and 1,000 microamperes through the nanotube.

16. The method of claim 10 wherein the particle comprises indium, thallium gallium, tin, titanium, lead, mercury, gold, silver, aluminum, platinum or copper.

17. The method of claim 10 wherein the particle discharges atoms towards the anode end of the nanotube.

18. The method of claim 10 further comprising the step of heating the nanotube.

19. The method of claim 10 wherein the atoms on the nanotube are moved in a bidirectional manner by changing the voltage such that the anode becomes the cathode, and vice versa, whereby particles alternately shrink and grow with the voltage polarity change, and mass transfer is accomplished in different directions, towards opposite ends of the nanotube.

* * * * *

UNITED STATES PATENT AND TRADEMARK OFFICE
CERTIFICATE OF CORRECTION

| | |
|---|---|
| PATENT NO. | : 7,341,651 B2 |
| APPLICATION NO. | : 11/085397 |
| DATED | : March 11, 2008 |
| INVENTOR(S) | : Regan et al. |

It is certified that error appears in the above-identified patent and that said Letters Patent is hereby corrected as shown below:

Title Page; item (57); in the Abstract, first page, column 2, line 6 of the Abstract, please delete "an" and insert -- a --, therefore.

Title Page; item (56); in the listing of OTHER PUBLICATIONS, page 2, column 1, line 1, please delete "ElectrokineticTransport" and insert -- Electrokinetic Transport --, therefore.

Title Page; item (56); in the listing of OTHER PUBLICATIONS, page 2, column 2, line 10, please delete "Microelecto" and insert -- Microelectro --, therefore.

In the specification, column 2, line 45, please delete "FIG." and insert -- FIGS. --, therefore.

At column 2, line 49, please delete "FIG." and insert -- FIGS. --, therefore.

At column 6, line 17, please delete "FIG." and insert -- FIGS. --, therefore.

At column 6, line 34, please delete "frames(FIGS." and insert -- frames (FIGS. --, therefore.

At column 6, line 41, please delete "FIG." and insert -- FIGS. --, therefore.

At column 9, line 47, please delete "Example2" and insert -- Example 2 --, therefore.

UNITED STATES PATENT AND TRADEMARK OFFICE
CERTIFICATE OF CORRECTION

PATENT NO. : 7,341,651 B2
APPLICATION NO. : 11/085397
DATED : March 11, 2008
INVENTOR(S) : Regan et al.

It is certified that error appears in the above-identified patent and that said Letters Patent is hereby corrected as shown below:

At column 13, line 23, in Claim 9, please delete "(c)" and insert -- (b) --, therefore.

Signed and Sealed this

Fourteenth Day of April, 2009

JOHN DOLL
*Acting Director of the United States Patent and Trademark Office*